United States Patent
Ying et al.

(10) Patent No.: US 6,943,039 B2
(45) Date of Patent: Sep. 13, 2005

(54) METHOD OF ETCHING FERROELECTRIC LAYERS

(75) Inventors: Chentsau Ying, Cupertino, CA (US); Padmapani C. Nallan, San Jose, CA (US); Ajay Kumar, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 126 days.

(21) Appl. No.: 10/365,008

(22) Filed: Feb. 11, 2003

(65) Prior Publication Data

US 2004/0157459 A1 Aug. 12, 2004

(51) Int. Cl.⁷ .............................................. H01L 21/00
(52) U.S. Cl. .................... 438/3; 438/733; 438/734; 438/695
(58) Field of Search ................. 438/706, 694, 438/714, 737, 734, 3, 733, 738, 689, 707, 710, 713, 735

(56) References Cited

U.S. PATENT DOCUMENTS

| | | | |
|---|---|---|---|
| 4,207,105 A | 6/1980 | Sato ........................... 430/432 |
| 4,985,113 A | 1/1991 | Fujimoto et al. ............ 156/643 |
| 5,258,093 A | * 11/1993 | Maniar ........................... 438/3 |
| 5,401,680 A | 3/1995 | Abt et al. ...................... 437/52 |
| 5,452,178 A | * 9/1995 | Emesh et al. ................ 361/303 |
| 5,468,684 A | 11/1995 | Yoshimori et al. ........... 437/228 |
| 5,658,820 A | * 8/1997 | Chung ............................. 438/3 |
| 5,789,323 A | 8/1998 | Taylor ......................... 438/706 |
| 5,976,928 A | 11/1999 | Kirlin et al. ................ 438/240 |
| 5,976,986 A | 11/1999 | Naeem et al. ............... 438/714 |
| 5,998,250 A | 12/1999 | Andricacos et al. ........ 438/240 |
| 6,171,898 B1 | 1/2001 | Crenshaw et al. .......... 438/240 |
| 6,180,446 B1 | 1/2001 | Crenshaw et al. .......... 438/240 |
| 6,184,074 B1 | 2/2001 | Crenshaw et al. .......... 438/238 |
| 6,194,281 B1 | 2/2001 | Kang et al. .................. 438/398 |
| 6,265,318 B1 | 7/2001 | Hwang et al. ............... 438/720 |
| 6,306,666 B1 | 10/2001 | Cho ................................. 438/3 |
| 6,323,127 B1 | 11/2001 | Andricacos et al. ........ 438/650 |
| 6,323,132 B1 | 11/2001 | Hwang et al. ............... 438/706 |
| 6,387,762 B2 | 5/2002 | Takasu et al. ............... 438/287 |
| 6,436,838 B1 | 8/2002 | Ying et al. ................... 438/710 |
| 6,444,542 B2 | 9/2002 | Moise et al. ................. 438/448 |
| 6,492,222 B1 | * 12/2002 | Xing ........................... 438/240 |
| 6,635,498 B2 | * 10/2003 | Summerfelt et al. ........... 438/3 |
| 6,686,237 B1 | * 2/2004 | Wofford et al. ............. 438/239 |
| 6,716,766 B2 | * 4/2004 | Ko ............................... 438/734 |
| 6,746,877 B1 | * 6/2004 | Hornik et al. .................. 438/3 |
| 6,852,636 B1 | * 2/2005 | O'Donnell ................... 438/706 |
| 2001/0050267 A1 | 12/2001 | Hwang et al. ................. 216/67 |
| 2001/0051381 A1 | 12/2001 | Yang et al. ...................... 438/3 |
| 2002/0117471 A1 | 8/2002 | Hwang et al. ................. 216/55 |
| 2002/0139774 A1 | 10/2002 | Hwang et al. ................. 216/67 |
| 2002/0155675 A1 | 10/2002 | Hartner et al. .............. 438/393 |
| 2003/0068897 A1 | * 4/2003 | Yates ........................... 438/710 |

(Continued)

FOREIGN PATENT DOCUMENTS

WO 01/89991 11/2001 ........... C01B/31/00

Primary Examiner—Olik Chaudhuri
Assistant Examiner—Michael K. Luhrs
(74) Attorney, Agent, or Firm—Moser, Patterson & Sheridan LLC; Joseph Bach

(57) ABSTRACT

Method of etching a ferroelectric layer includes etching an upper electrode and partially through a ferroelectric layer. A dielectric material is subsequently deposited upon the upper electrode and the partially etched ferroelectric layer. A second etch step completely etches through the remaining portion of the ferroelectric layer and also etches lower electrodes. A random access memory apparatus is constructed that includes a first conductive layer, a dielectric layer disposed upon the first conductive layer, a second conductive layer disposed upon the dielectric layer, where such layers form a stack having a sidewall. Further, the sidewall has a protective dielectric film disposed thereon and extending from the second layer down to the dielectric layer.

78 Claims, 5 Drawing Sheets

U.S. PATENT DOCUMENTS

2003/0119211 A1 * 6/2003 Summerfelt et al. ............ 438/3
2003/0143853 A1 * 7/2003 Celli et al. .................. 438/694
2003/0180968 A1 * 9/2003 Nallan et al. ................... 438/3
2003/0215960 A1 * 11/2003 Mitsuhashi .................... 438/3
2004/0038546 A1 * 2/2004 Ko .............................. 438/710
2004/0063223 A1 * 4/2004 Costrini et al. ................ 438/3

* cited by examiner

METHOD OF ETCHING FERROELECTRIC LAYERS

BACKGROUND OF THE INVENTION

1. Field of the Invention

The present invention generally relates to etching ferroelectric materials and, more particularly, to the formation of protective sidewalls of ferroelectric layers during memory device fabrication.

2. Description of the Related Art

Lead zirconate titanate (PZT), a ferroelectric oxide material, is often used for memory cell applications to create ferroelectric random access memory (FeRAM) devices. Various methods for forming the FeRAM devices and processing PZT have been discussed in the art. One method of forming a FeRAM device is to use two separate masks with two separate etching steps. The first mask and etch step forms the top electrode and the second mask and second etch step etches through the PZT and forms the bottom electrode. This process is not desirable because it is time consuming in that it requires the formation and subsequent stripping of two different masks and two corresponding etch steps to be conducted with formation of the masks. Additionally, since the top and bottom electrodes are typically formed from two different steps, they are usually two different sizes. Such a condition makes it difficult to scale down overall device size, and thereby increase yield on a substrate.

The two mask approach was substituted by a one mask approach in an effort to prevent the top and bottom electrode from having two different sizes. However, when etching various layers (and thereby creating a high sidewall to the devices that are formed) residues collect on the sidewalls. These residues are byproducts of the etching process and typically contain metallic components having low volatility. The metallic residue easily redeposits on the sidewalls of the device and creates a short circuit between top and bottom electrodes of the device which is an undesirable result of one mask etching. It was subsequently considered to create tapered sidewalls in the devices. Creating a tapered sidewall was beneficial in that it enhanced the complete etching and exhausting of byproducts and reducing residues; however, creating a device with a tapered profile changes the overall surface area of the device. Specifically, varying the surface area of the device changes the overall critical dimensions of the device to a value that is typically unacceptably large for the application desired.

Therefore, a need exists for a method of etching ferroelectric layers with reduced by-product formation and increased device reliability and electrical characteristics and desired device size.

SUMMARY OF THE INVENTION

Embodiments of the present invention generally relate to a method of etching ferroelectric material layers and a resultant apparatus formed thereby, for example, an FeRAM device. In one embodiment of the invention, an etching process comprises etching a top electrode and a portion of the ferroelectric layer. A dielectric deposition step is then performed to form a protective layer on the sidewalls and exposed ferroelectric layer. A second etching step is then performed to etch the remainder of the ferroelectric layer and the bottom electrode. The use of a sidewall deposition step in between two etching steps reduces the accumulation of conductive residues forming between the top and bottom electrodes and possible shorting of the device. Pre-heating of the layers to be etched is performed to increase the chemical reactivity and volatility of the reactants.

In another embodiment of the invention, a method of forming a capacitor having dielectric portions disposed between first electrodes and second electrodes is provided. The process comprises etching the first conductive layer to form first electrodes and a portion of the ferroelectric layer. A protective layer of dielectric material is then deposited over the partially etched structure. The unetched portion of the ferroelectric layer and the second conductive layer are then etched to form a dielectric portion and second electrodes.

In another embodiment of the invention, a random access memory apparatus is constructed that includes a first conductive layer, a dielectric layer disposed upon the first conductive layer, a second conductive layer disposed upon the dielectric layer, where all of said layers form a stack having a sidewall. Further, the sidewall has a protective film disposed thereon and extends from the second layer down to the dielectric layer. In one specific example, the protective sidewall film extends from the second conductive layer to half-way down the dielectric layer. The dielectric layer is fabricated from a ferroelectric material and can be selected from the group consisting of PZT and SBT. The protective sidewall film is fabricated from a dielectric material and can be selected from the group consisting of polymer based materials, oxides, nitrides and alumina. The protective layer is deposited to a thickness in the range of approximately 100–600 Angstroms and in one example may be deposited to a thickness of approximately 300.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
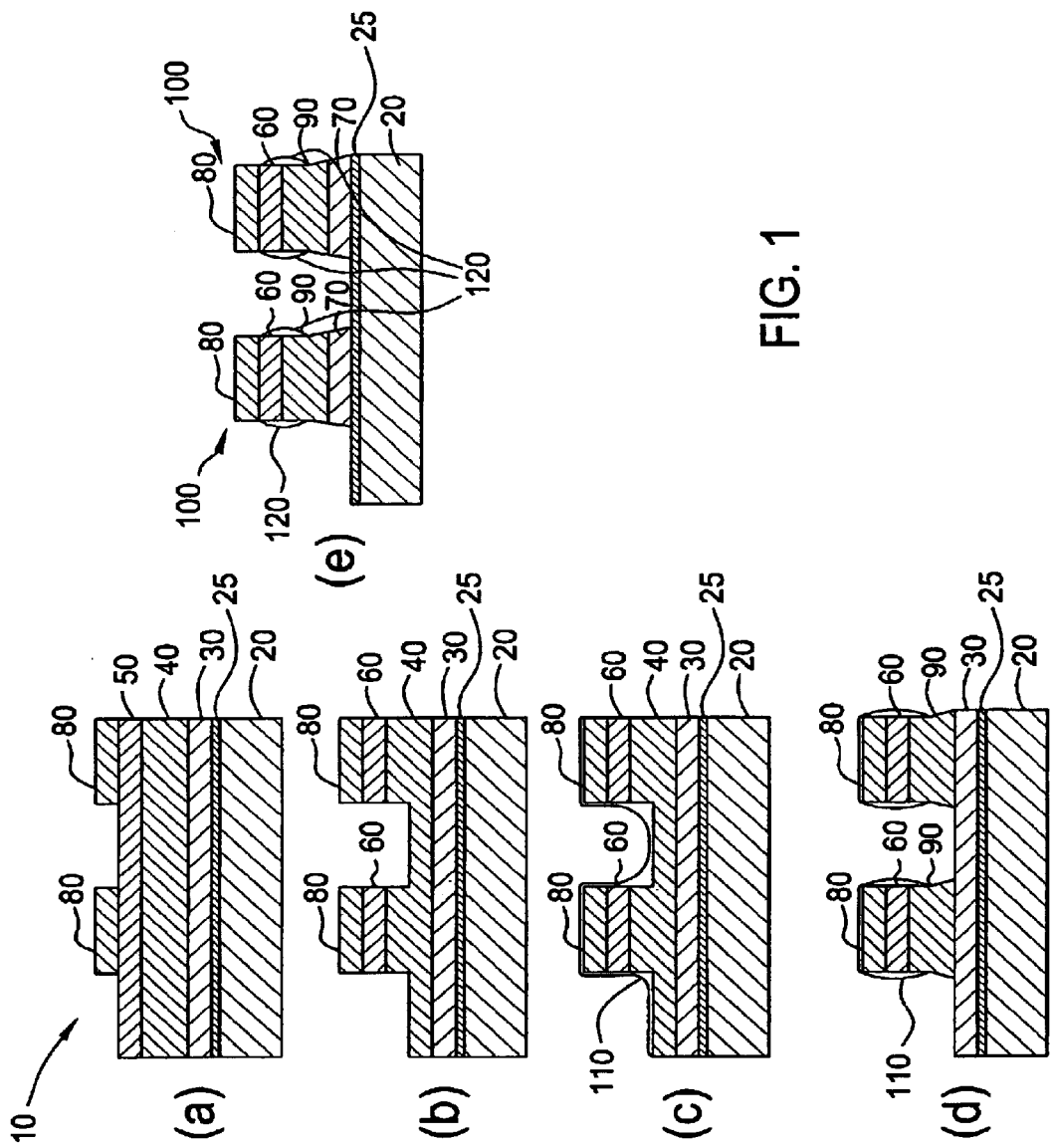
FIG. 1a–FIG. 1e depict cross-sectional views of a substrate during various stages of processing according to one embodiment of the present invention.
Figure 2:
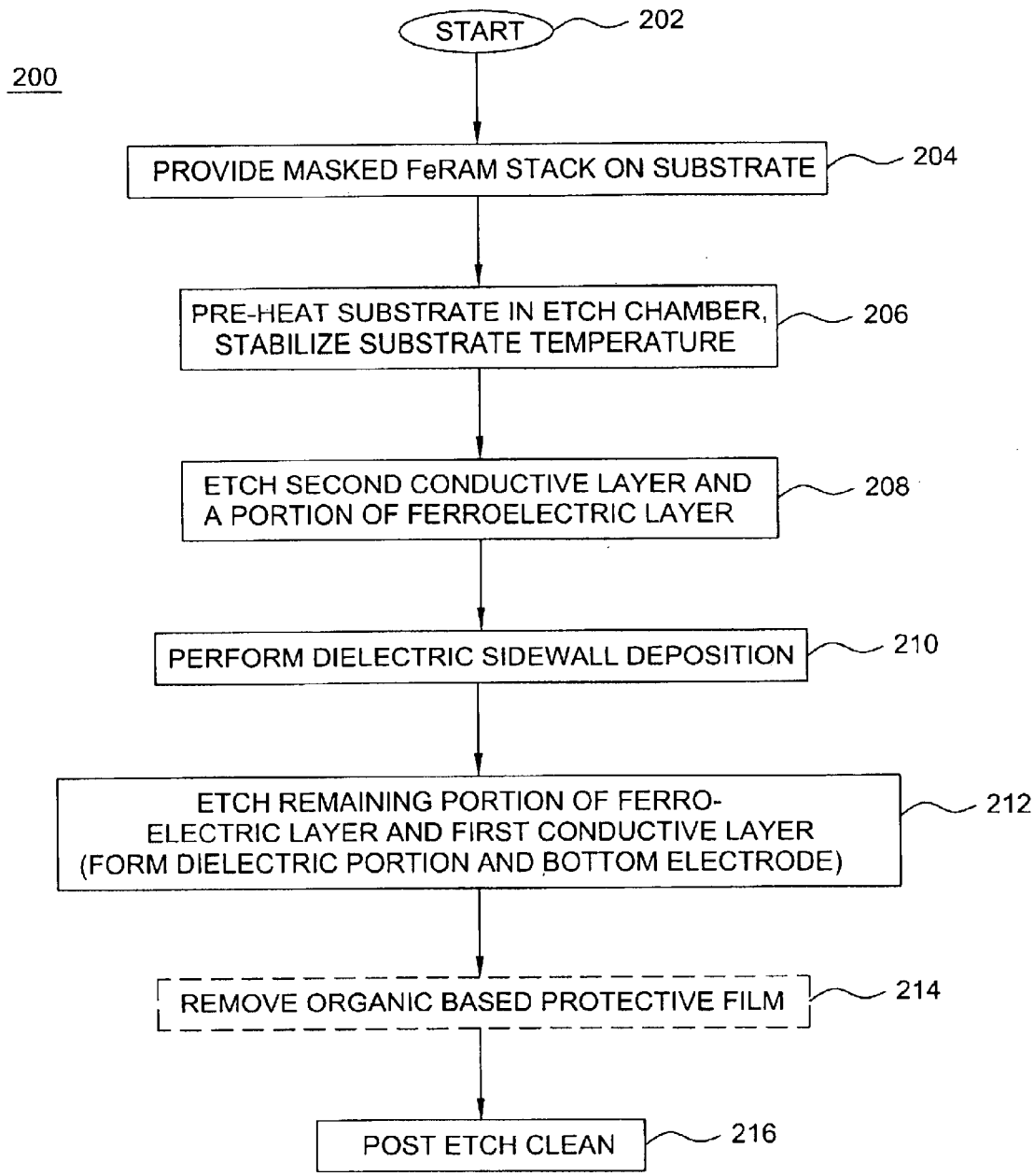
FIG. 2 depicts a series of method steps in accordance with the present invention.

Embodiments described herein relate to a method of etching a ferroelectric film stack. FIG. 1a–FIG. 1e are cross-sectional views of a substrate during various stages of processing according to one embodiment of the present invention. A corresponding method 200 is depicted by the flow chart seen in FIG. 2 and the reader is directed to view FIGS. 1 and 2 with the corresponding written specification. The method 200 begins at step 202 and proceeds to step 204 where a stack of conductive, ferroelectric and other attendant layers 10 necessary for forming a ferroelectiic memory device are provided on a substrate 20 as shown in FIG. 1a. A specific discussion of the steps for forming such layers and a hard mask 80 for etching same is found in pending and co-owned patent application Ser. No. 10/210,550 filed Jul. 31, 2002, entitled "METHOD OF ETCHING FERROELECTRIC LAYERS", and is herein incorporated by reference. The stack 10 includes (but is not limited to) a first conductive layer (i.e, a bottom electrode layer) 30 such as iridium (Ir), a ferroelectric layer 40 such as lead zirconate titanate (PZT) or strontium barium titanate (SBT), a second conductive layer (i.e., a top electrode layer) 50 such as iridium (Ir) and the hard mask 80 (i.e., layer of Ti, TIN, TiW or TIAIN of a thickness of approximately 500–3000 Angstroms). The conductive layers 30 and 50 are formed, for example, by chemical vapor deposition (CVD) or physical vapor deposit (PVD). The ferroelectric layer 40 is formed, for example, by PVD, a sol-gel process, or MOCVD. Optionally, a titanium-based layer adhesion layer 25 may be disposed on the substrate 20 prior to formation of the first conductive layer 30. The adhesion layer 25 is selected from the group consisting of titanium, titanium nitride and titanium aluminum nitride. The adhesion layer also serves as a diffusion barrier between the to-be-formed device and the substrate as well as promoting good adhesion of the material of the first conductive layer 30 to the substrate 20.

In step 206, the substrate 20 is placed in an etching chamber of a predetermined plasma etching apparatus. The substrate 20 is pre-heated (i.e., heated to a predetermined temperature prior to further processing) when a substrate support temperature is maintained within a range not lower than 200 degrees and not higher than 600 degrees. The temperature may be, for example, 350 degrees. In one embodiment, the wafer is pre-heated by using plasma formed by a plasma source power supply 318 of FIG. 3 and explained in greater detail below. An inert gas, such as argon (Ar) or nitrogen $N_2$ is supplied to the chamber at a flow rate between about 10 standard cubic centimeters (sccm) to 200 sccm, and the chamber pressure may be a pressure between about 5 milliTorr and 50 milliTorr. The plasma source power supply 318 is set to provide between about 500 Watts (W) and 2000 W at a frequency about 2 MHz. In one specific embodiment, argon is used as the process gas, where the flow rate is set to 100 sccm, the chamber pressure is set to 30 milliTorr, and the source power supply 318 is set to 750 W at a frequency of 2 MHz. It is noted that there is no substrate bias power applied to the support pedestal 316 during pre-heating.

After the temperature of the substrate 20 becomes stable at 350 degrees, the method proceeds to step 208 where process gas is introduced into the etching chamber and etching commences. Portions of the second conductive layer 50 and ferroelectric layer 40 that are not covered by the hard mask 80 are etched. Portions of the second conductive layer 50 and ferroelectric layer 40 that are covered by hard mask 80 are unetched, thus forming upper electrodes 60 and a partially etched ferroelectric layer, as shown in FIG. 1b. Partially etching the ferroelectric layer 40 includes etching up to approximately 50% of the thickness of the ferroelectric layer 40. Process gases for the etching step 208 are selected from the group consisting of CO, $O_2$, $N_2$, $Cl_2$ and Ar. Process conditions useful for etching the ferroelectric layer 40 are, for example, a flow rate of CO of 60 standard cubic centimeters per minute (sccm), a flow rate of Ar of 15 sccm, a flow rate of $CF_4$ or $CHF_3$ of 12 sccm, a flow rate of $Cl_2$ of 15 sccm, a flow rate of $O_2$ of 10 sccm, a chamber pressure of about 20 mTorr, a power output for plasma generation of about 1250 W, a substrate bias output of 350 W, and a substrate temperature of 350 degrees Celsius. The range of possible process parameters include a flow rate of CO of between 20–200 sccm, a flow rate of Ar of approximately 0–50 sccm, a flow rate of $CF_4$ or $CHF_3$ of approximately 5–15 sccm, a flow rate of chlorine of approximately 5–50 sccm, a flow rate of $O_2$ of approximately 0–50 sccm, a power output for plasma generation of about 200–3000 W, a substrate bias output power of approximately 100–500 W, and a substrate temperature range of approximately 200–600 degrees Celsius. Therefore, a range of flow rate ratios include approximately 0.4:1 to 40:1 CO:Cl.

More specifically, etch step 208 contains 2 mini-etch steps. The first mini-etch step establishes processing conditions useful for etching the second conductive layer 50 and then a second mini-etch step which establishes process conditions useful for etching the ferroelectric layer 40. In this way, a smooth transition is made when switching from etching of the second conductive layer 50 (typically iridium) to etching of the ferroelectric layer 40 (typically PZT). The processing conditions for the first mini-etch step are for example a flow rate of CO of 60 sccm, a flow rate of AR of 15 sccm, a flow rate of $N_2$ of 15 sccm, a flow rate of $Cl_2$ of 15 sccm, a flow rate of $O_2$ of 10 sccm, a chamber pressure of about 20 mTorr, a power output for plasma generation of about 1250 W, a substrate bias output of approximately 350 W, and a substrate temperature of approximately 350° C. The range of possible process parameters are identical to those described above with respect to etching step 208 as described above. As the transition is made from the first mini-etch step to the second mini-etch step, the flow rate of $N_2$ is replaced with a flow rate of a fluorocarbon containing gas. The fluorocarbon containing gas is selected from the group consisting of $CF_4$ and $CHF_3$. An exemplary flow rate is described above as 12 sccm with a range of about 5–15 sccm. The second mini-etch step is stopped when, as described above, approximately 50 percent of thickness of ferroelectric layer 40 is etched away.

At step 210, a deposition step is performed to deposit a protective layer 110 over the partially etched ferroelectric layer 40 and the second conductive (top electrode) layers 50. The spacer layer 110 is a dielectric (i.e., nonconductive) material and in one example is deposited via a plasma enhanced CVD operation as seen in FIG. 1c. The protective layer material may be selected from the group of dielectric materials consisting of polymers (i.e., $CHF_3$ and $C_4F_8$), oxides and nitrides (i.e., including but not limited to aluminum nitride (AlNx) and aluminum oxide (AlOx). The deposition step 210 is performed until the protective layer 110 reaches a thickness in the range of approximately 100–600 Angstroms. In one example of the invention, the protective layer 110 is formed to be approximately 300 Angstroms thick. The protective layer 110 prevents conductive etchant by-products from forming a conductive (shorting) path between conductive layers 30 and 50. The range of possible process parameters include a flow rate of $CHF_3$ of approximately 20–200 sccm, a chamber pressure of approximately 5–50 mTorr, a substrate bias power of approximately 0–50 W, a plasma source generation power of approximately 300–2000 W and a temperature range of approximately 5–80° C. One example of the deposition parameters and process used to form protective layer 110 includes a flow rate of $CHF_3$ of approximately 100 sccm at a pressure of approximately 35 mTorr, approximately 0 W of biasing power, approximately 500 W of plasma source generation power and a temperature of approximately 40 degrees Celsius. Such example of a polymer based deposition step is performed in-situ. That is, the deposition step 210 is performed in the same chamber in which the first etching step 208 was conducted. In an alternate embodiment of the invention, the deposition step 210 is performed ex-situ. That is, the deposition of aluminum oxide or nitride type dielectric materials is performed in a dedicated deposition chamber for physical vapor deposition (PVD), such chambers being known to those skilled in the art.

At step 212 and as seen in FIG. 1d, a second etching step is performed to etch the remaining portion of the ferroelectric layer 40 that was not etched in the first etch step 208. The second etch step 212 and its parameters are substantially similar to those of the first etch step 208 with the exception of the ordering of the mini-etch steps as described below. As a result of the second etch step 212, the ferroelectric layer 40 is etched completely therethrough to form dielectric portions 90. Additionally, some of the spacer or protective layer 110 is also consumed. As the second etch step 212 continues and as seen in FIG. 1e the first conductive layer 30 is etched completely therethrough so as to form bottom electrodes 70. At the end of the second etch process 212, the protective or spacer layer material that was deposited on top of hard mask 80 is mostly completely etched away. Some of the protective material may remain on the sidewalls of the capacitor devices 100 formed by the process. Specifically, a thin dielectric film 120 (i.e., remnants of the spacer layer 110) is shown on either side of the capacitor devices 100 formed in FIG. 1e. In other words, the second etch step 212 is substantially anisotropic in nature. As such, the etching will take place mostly upon the horizontal surfaces (such as the layers) and not upon vertical surfaces (such as the device sidewalls). The dielectric film 120 is the result of the substantially anisotropic etch process.

More specifically second etch step 212, etches through the remaining portion of the ferroelectric layer 40 as well as first conductive layer 30. Accordingly, second etch step 212 contains a first mini-etch step that establishes processing conditions for etching the ferroelectric layer 40 and a second mini-etch step that establishes processing conditions to etch the first conductive layer 30. The first mini-etch step of second etch step 212 establishes processing conditions for example that are substantially similar to the second mini-etch step of the first etch step 208. That is, a flow rate of either $CF_4$ or $CHF_3$ accompanies the remaining recipe components of CO, Ar, $Cl_2$, $O_2$ at the previously described chamber and power conditions. The first mini-etch step of second etch step 212 concludes with the completion of etching with a ferroelectric layer 40 and a replacing of the $CF_4$ or $CHF_3$ flow with a flow of $N_2$ with all other parameters remaining unchanged. The commencement of the flow of $N_2$ establishes the proper process conditions for the second mini-etch step of second etch step 212 which establishes processing conditions for etching the first conductive layer 30.

In step 214, an optional step of stripping the protective dielectric film 120 may be performed. Specifically, if the protective layer material 110 is organic based, a stripping process is performed. An example of possible process parameters for the stripping process include a flow rate of $Cl_2$ of approximately 100 sccm, a flow rate of $O_2$ of approximately 50 sccm, a chamber pressure of approximately 20 mTorr, a substrate bias power of approximately 10 W and a plasma generation source power of approximately 1000 W. If the film is not organic based, the dielectric protective film 120 is left intact.

At step 216, a post etch cleaning process is performed to remove any remaining residues (metal residues and the like) created during the first and second etch processes. For example, the residues are removed using a process that comprises a wet dip in a solvent comprising any $NH_4OH/H_2O_2/H_2O$ followed by a rinse in distilled water.

Figure 5:
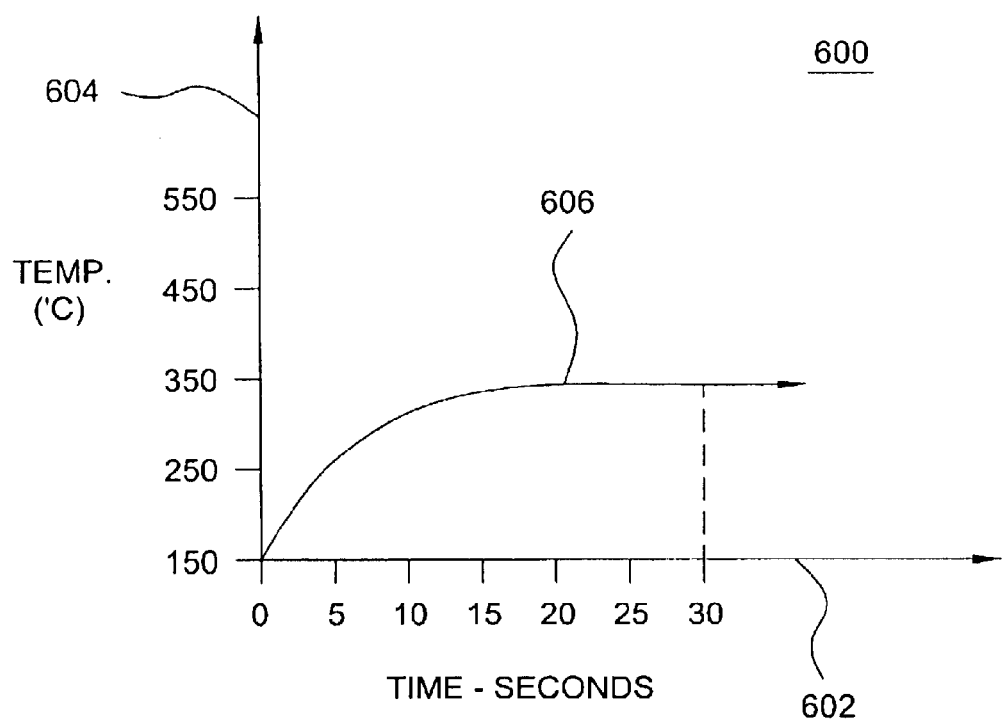
FIG. 5 depicts a graphical representation of a wafer pre-heating step in accordance with the principles of the subject invention.

FIG. 5 depicts a graphical representation 600 of wafer pre-heating in accordance with the principles of step 206. In particular, the graph 600 comprises an x-axis 602 and a y-axis 604, where the x-axis 602 represents time as measured in seconds (sec), while the y-axis 604 represents temperature as measured in degrees Celsius (° C.). Curve 606 represents the increasing temperature of the substrate as it is being pre-heated over time. It is noted that the temperature of the substrate is measured from a measuring device (e.g., a thermocouple, optical sensor, among others) positioned in the substrate support pedestal 316.

Curve 606 shows that once the inert gas (e.g., Ar) is ignited to form a plasma 355, the temperature of the support pedestal 316, and consequently, the substrate 20 rises. The temperature of the substrate 20 may be pre-heated between about 200° C. to 600° C., and in one specific embodiment, the substrate 20 is pre-heated to about 350° C. Generally, pre-heating the substrate 20 to about 350° C. requires about 30 seconds.

Figure 3:
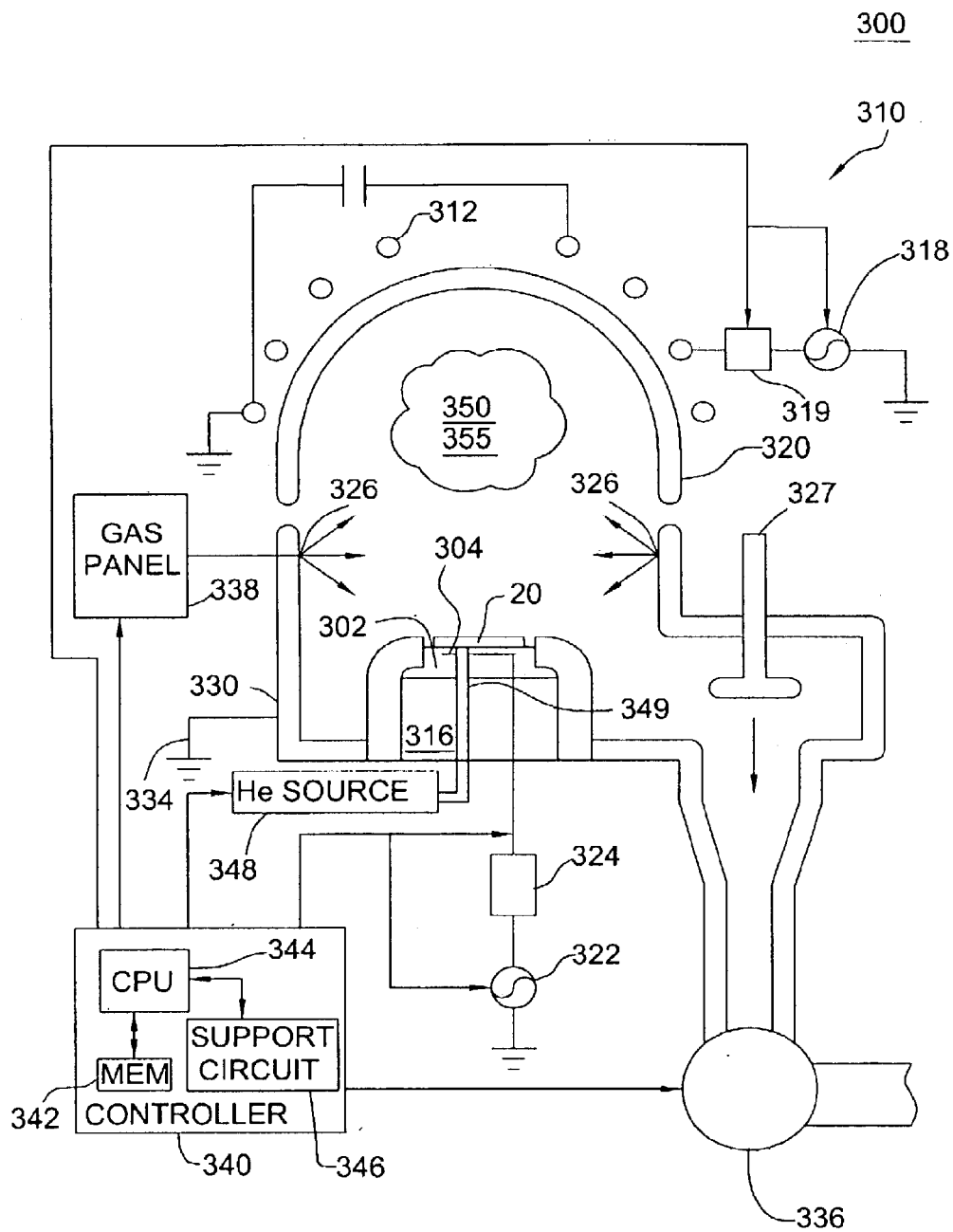
FIG. 3 depicts a schematic diagram showing an exemplary plasma etching apparatus that may be used to practice embodiments of the invention described herein.

FIG. 3 depicts a schematic diagram of the DPS reactor 300 that may be used to accomplish the method of the present invention and more specifically to perform one or more of the above-described etching steps. The reactor 300 comprises a process chamber 310 having a wafer support pedestal 316 within a conductive body (wall) 330, and a controller 340.

The support pedestal (cathode) 316 is coupled, through a first matching network 324, to a biasing power source 322. The source 322 generally is capable of producing up to 500 W of continuous and pulsed power at a tunable frequency in a range from 50 kHz to 13.56 MHz. In greater detail, the support pedestal 316 comprises an electrostatic chuck 302 having a monopolar electrode 304 embedded therein and electrically connected to the biasing power source 322. For this embodiment, a plasma 355 provides a completed circuit as between the plasma source power 318 and ground 334. Accordingly, the generation of a plasma 355 results in the substrate 20 being chucked to the electrostatic chuck 302 in a conventional manner as is known in the art. In instances where a bipolar chuck is utilized to secure the substrate 20 to the support pedestal 316, the substrate 20 is chucked prior to pre-heating. In other embodiments, the source 322 may be a DC or pulsed DC source. The wall 330 is capped with a dome-shaped dielectric ceiling 320. Other modifications of the chamber 310 may have other types of ceilings, e.g., a flat ceiling. Typically, the wall 330 is coupled to an electrical ground 334. Above the ceiling 320 is disposed an inductive coil antenna 312. The antenna 312 is coupled, through a second matching network 319, to a plasma power source 318. The source 318 typically is capable of producing up to 3000 W at a tunable frequency in a range from 50 kHz to 13.56 MHz.

A controller 340 comprises a central processing unit (CPU) 344, a memory 342, and support circuits 346 for the CPU 344 and facilitates control of the components of the DPS etch process chamber 310 and, as such, of the etch process, as discussed below in further detail.

In operation, the support 20 is placed on the pedestal 316 and process gases are supplied from a gas panel 338 through entry ports 326 and form a gaseous mixture 350. The gaseous mixture 350 is ignited into a plasma 355 in the chamber 310 by applying power from the sources 318 and 322 to the antenna 312 and the cathode 316, respectively. The pressure within the interior of the chamber 310 is controlled using a throttle valve 327 and a vacuum pump 336. The temperature of the chamber wall 330 is controlled using liquid-containing conduits (not shown) that run through the wall 330.

The temperature of the substrate 20 is controlled by stabilizing a temperature of the support pedestal 316. In one embodiment, the helium gas from a source 348 is provided via a gas conduit 349 to channels formed by the back of the substrate 20 and grooves (not shown) on the pedestal surface. The helium gas is used to facilitate heat transfer between the pedestal 316 and the substrate 20. During the processing, the pedestal 316 may be heated by a resistive heater (not shown) within the pedestal to a steady state temperature and then the helium gas facilitates uniform heating of the substrate 20. Using thermal control, the substrate 20 is maintained at a temperature of between 10 and 600 degrees Celsius depending upon which specific etching step is performed.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the CPU 344 may be one of any form of general purpose computer processor that can be used in an industrial setting for controlling various chambers and sub-processors. The memory 342 is coupled to the CPU 344. The memory 342, or computer-readable medium, may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as software routine. The software routine may also be stored and/or executed by a second CPU (not shown) that is remotely located from the hardware being controlled by the CPU 344.

The software routines are executed after the substrate 20 is positioned on the pedestal 316. The software routines, when executed by the CPU 344, transform the general purpose computer into a specific purpose computer (controller) 340 that controls the chamber operation such that the etching process is performed in accordance with the method of the present invention.

Although the present invention is discussed as being implemented as a software routine, some of the method steps that are disclosed herein may be performed in hardware as well as by the software controller. As such, the invention may be implemented in software as executed upon a computer system, in hardware as an application specific integrated circuit (ASIC), or other type of hardware implementation, or a combination of software and hardware.

Figure 4:
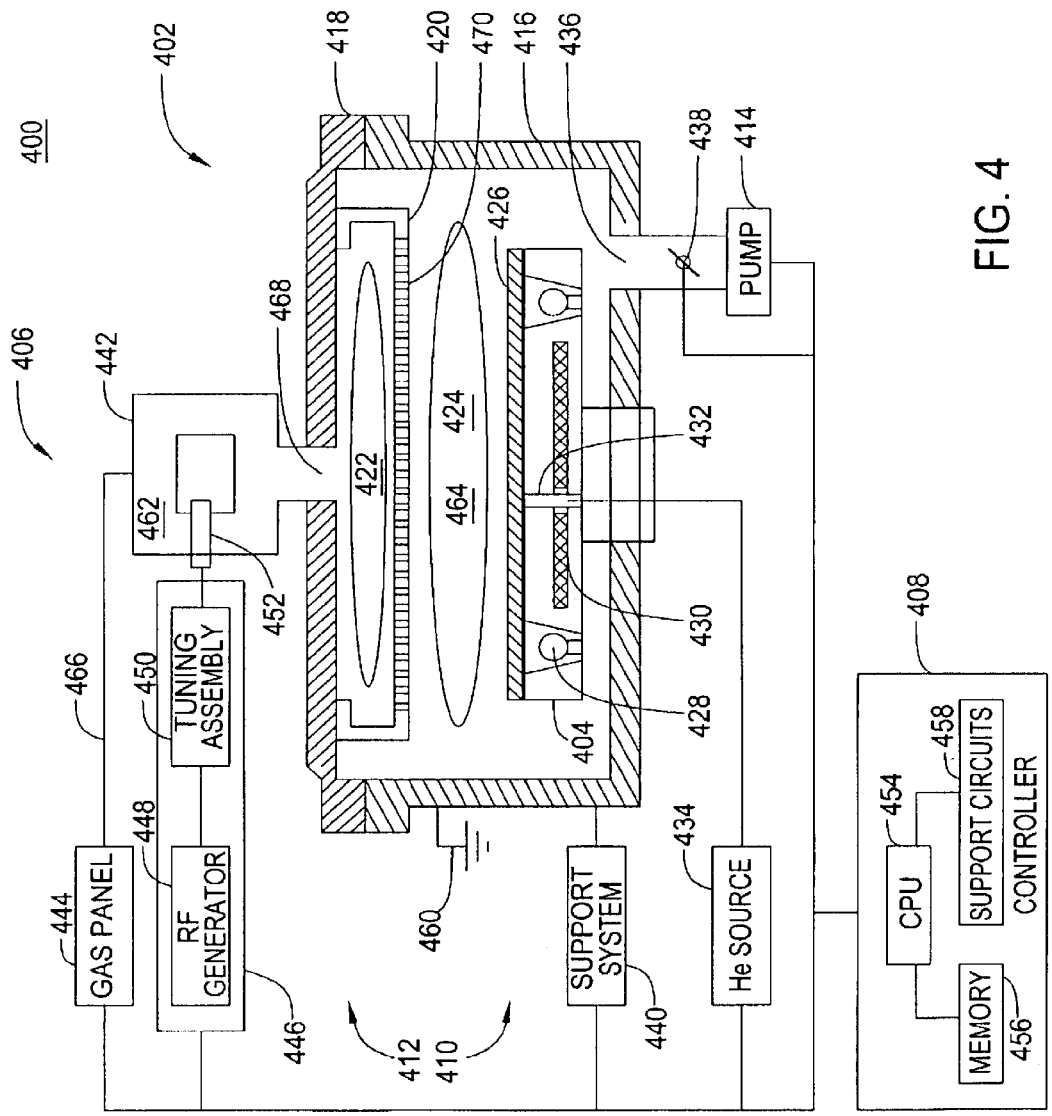
FIG. 4 depicts a schematic, cross sectional view of a stripping module.

FIG. 4 depicts a schematic diagram of a reactor 400 that may be used to practice portions of the method 200 (i.e., striping steps). The reactor 400 comprises a process chamber 402, a remote plasma source 406, and a controller 408. In one embodiment, the reactor 400 is an AXIOM® chamber that is manufactured and sold by Applied Materials, Inc. of Santa Clara, Calif.

The process chamber 402 generally is a vacuum vessel, which comprises a first portion 410 and a second portion 412. In one embodiment, the first portion 410 comprises a substrate pedestal 404, a sidewall 416 and a vacuum pump 414. The second portion 412 comprises a lid 418 and a gas distribution plate (showerhead) 420, which defines a gas mixing volume 422 and a reaction volume 424. The lid 418 and sidewall 416 are generally formed from a metal (e.g., aluminum (Al), stainless steel, and the like) and electrically coupled to a ground reference 460.

The substrate pedestal 404 supports a substrate (wafer) 426 within the reaction volume 424. In one embodiment, the substrate pedestal 404 may comprise a source of radiant heat, such as gas-filled lamps 428, as well as an embedded resistive heater 430 and a conduit 432. The conduit 432 provides a gas (e.g., helium) from a source 434 to the backside of the wafer 426 through grooves (not shown) in the wafer support surface of the pedestal 404. The gas facilitates heat exchange between the support pedestal 404 and the wafer 426. The temperature of the wafer 426 may be controlled between about 20 and 400 degrees Celsius.

The vacuum pump 414 is adapted to an exhaust port 436 formed in the sidewall 416 of the process chamber 402. The vacuum pump 414 is used to maintain a desired gas pressure in the process chamber 402, as well as evacuate the post-processing gases and other volatile compounds from the chamber. In one embodiment, the vacuum pump 414 comprises a throttle valve 438 to control a gas pressure in the process chamber 402.

The process chamber 402 also comprises conventional systems for retaining and releasing the wafer 426, detecting an end of a process, internal diagnostics, and the like. Such systems are collectively depicted as support systems 440.

The remote plasma source 406 comprises a power source 446, a gas panel 444, and a remote plasma chamber 442. In one embodiment, the power source 446 comprises a radio-frequency (RF) generator 448, a tuning assembly 450, and an applicator 452. The RF generator 448 is capable of producing of about 200 to 3000 W at a frequency of about 200 to 600 kHz. The applicator 452 is inductively coupled to the remote plasma chamber 442 and energizes a process gas (or gas mixture) 462 to a plasma 464 in the chamber. In this embodiment, the remote plasma chamber 442 has a toroidal geometry that confines the plasma and facilitates efficient generation of radical species, as well as lowers the electron temperature of the plasma. In other embodiments, the remote plasma source 406 may be a microwave plasma source, however, the stripping rates are generally higher using the inductively coupled plasma.

The gas panel 444 uses a conduit 466 to deliver the process gas 462 to the remote plasma chamber 442. The gas panel 444 (or conduit 466) comprises means (not shown), such as mass flow controllers and shut-off valves, to control gas pressure and flow rate for each individual gas supplied to the chamber 442. In the plasma 464, the process gas 462 is ionized and dissociated to form reactive species.

The reactive species are directed into the mixing volume 422 through an inlet port 468 in the lid 418. To minimize charge-up plasma damage to devices on the wafer 426, the ionic species of the process gas 462 are substantially neutralized within the mixing volume 422 before the gas reaches the reaction volume 424 through a plurality of openings 470 in the showerhead 420.

The controller 408 comprises a central processing unit (CPU) 454, a memory 456, and a support circuits 458. The CPU 454 may be of any form of a general-purpose computer processor used in an industrial setting. Software routines can be stored in the memory 456, such as random access memory, read only memory, floppy or hard disk, or other form of digital storage. The support circuits 458 are conventionally coupled to the CPU 454 and may comprise cache, clock circuits, input/output sub-systems, power supplies, and the like.

The software routines, when executed by the CPU 454, transform the CPU into a specific purpose computer (controller) 408 that controls the reactor 400 such that the processes are performed in accordance with the present invention. The software routines may also be stored and/or executed by a second controller (not shown) that is located remotely from the reactor 400.

Using the first etch/deposit protective layer/second etch steps of the present invention, the optimal device size is obtained and repeatable because the bottom electrode is formed by the same mask 80 as the top electrode. Although the bottom electrode and a portion of the dielectric layer may be slightly larger than the top electrode, the critical dimensions of the device are not exceeded. Additionally, etchant by-products have a greatly reduced effect on the formed devices as shorting of the ferroelectric layer is prevented. That is, metallic residues cannot readily form a conductive path from the top electrode 60 to the bottom electrode 70 because of the protective sidewall 120. As was discussed with regard to the prior art, the by-products produced during the etching process normally have a low volatility, which results in the undesirable formation of the residues on the layers. By providing the pre-heating step 206 of method 200 the temperature of the wafer is increased to some predetermined temperature such that the volatility of the by-products formed during the subsequent etching steps 208 to 212 also increases. Specifically, in the enclosed chamber environment (volume), the by-products, when subjected to an increase in temperature, are also subjected to an increased partial pressure. Such conditions increases the likelihood of suspending by-products in a plasma and subsequent exhausting of the same from the volume, rather than the by-products forming residue and veil-like structures. The increased temperature also increases the chemical reactivity and volatility of the etchant gases and by-products thereby creating a cleaner and more complete etching of the stack 10. Semiconductor devices manufactured using the method of the present invention are advantageous in that the reliability of the devices formed is improved.

The scope of the present invention is not limited to the embodiments discussed above. For example, while the conductive layers are described above as iridium (Ir) and platinum (Pt) layers, other materials, including other precious metals such as ruthenium (Ru), and the like, as well as conductive oxides such as iridium oxide ($IrO_2$) and ruthenium oxide ($RuO_2$) may be used. Furthermore, while the ferroelectric layer is described above as a PZT layer, the ferroelectric layer may include other elements such as lanthanum (La), niobium (Nb) and bismuth (Bi). Furthermore, the above description details the use of the etching method for use in the fabrication of a capacitor, the etching method of the present invention may be used to form other devices. The substrate 20 may be, for example, a semiconductor substrate such as a silicon (Si) wafer, a silicon wafer having an insulating layer such as a silicon dioxide ($SiO_2$) layer formed thereon, or a Si wafer upon which a partially completed semiconductor integrated circuit has been fabricated. Furthermore, while the hard masks are described above as titanium based, this does not preclude other types of hard mask materials from being used such as, but not limited to silicon-based inorganic insulating materials.

Similarly, the fluorocarbon gas is not limited to $CHF_3$. In general, it may be a compound represented by a chemical formula $C_xH_y$ or $C_xH_yF_z$, such as, for example, $C_2H_4$. Furthermore, the nitrogen-containing gas is not limited to $N_2$ and may include, for example, $NF_3$.

While the foregoing is directed to embodiments of the present invention, other and further embodiments of the invention may be devised without departing from the basic scope thereof, and the scope thereof is determined by the claims that follow.

What is claimed is:

1. A method of etching a ferroelectric layer, the method comprising:
   (a) providing a substrate comprising a ferroelectric layer;
   (b) partially etching said ferroelectric layer;
   (c) depositing a protective layer over portions of the partially etched ferroelectric layer, wherein the protective layer is a polymer deposited in-situ with respect to a location in which the etch of step (b) is performed; and
   (d) substantially anisotropically etching the partially etched ferroelectric layer.

2. The method of claim 1 wherein the step (b) etch further comprises etching approximately 50% of the thickness of the ferroelectric layer.

3. The method of claim 1 wherein the protective layer further comprises a dielectric material.

4. The method of claim 3, wherein the dielectric material is selected from the group consisting of polymer based materials, oxides, nitrides and alumina.

5. The method of claim 3, wherein the protective layer is deposited to a thickness in the range of approximately 100–600 Angstroms.

6. The method of claim 5 wherein the protective layer is deposited to a layer of a thickness of approximately 300 Angstroms.

7. The method of claim 1, wherein the step (b) etch is conducted by flowing a carbon monoxide gas at a range of approximately 20–200 sccm, flowing a fluorocarbon gas at a flow rate of approximately 5–15 sccm, flowing a chlorine gas at a range of approximately 5–50 sccm, flowing an Argon gas at a range of approximately 0–50 sccm, flowing an oxygen gas at a rate of approximately 0–50 sccm, sustaining a process chamber pressure in a range of approximately 2–50 mTorr, sustaining a bias power in the range of approximately 100–500 Watts, sustaining a plasma generating source power in the range of approximately 200–3000 W and sustaining a process temperature in the range of approximately 200–600° C.

8. The method of claim 7, wherein the step (b) etch further comprises flowing a carbon monoxide gas at a rate of approximately 60 sccm, flowing a fluorocarbon gas selected from the group consisting of $CF_4$ and $CHF_3$ at a rate of approximately 15 sccm, flowing a chlorine gas at rate of approximately 12 sccm, flowing an Argon gas at a rate of approximately 15 sccm, flowing an oxygen gas at a rate of approximately 10 sccm, sustaining a chamber pressure of approximately 20 mTorr, maintaining a bias power of approximately 350 W, sustaining a plasma generating source power of approximately 1250 W and sustaining a chamber temperature of approximately 350° C.

9. The method of claim 7, wherein the step (b) etch further comprises a first mini-etch step and a second mini-etch step.

10. The method of claim 9 wherein the first mini-etch step is conducted by flowing a carbon monoxide gas at a range of approximately 20–200 sccm, flowing a nitrogen gas at a flow rate of approximately 0–15 sccm, flowing a chlorine gas at a range of approximately 5–50 sccm, flowing an Argon gas at a range of approximately 0–50 sccm, flowing an oxygen gas at a rate of approximately 0–50 sccm, sustaining a process chamber pressure in a range of approximately 2–50 mTorr, sustaining a bias power in the range of approximately 100–500 Watts, sustaining a plasma generating source power in the range of approximately 200–3000 W and sustaining a process temperature in the range of approximately 200–600° C.

11. The method of claim 10 further comprising transitioning the flow of, nitrogen gas with a flow of fluorocarbon gas to initiate the second mini-etch step.

12. The method of claim 11 where the second mini-etch step is conducted by flowing a carbon monoxide gas a range of approximately 20–200 sccm flowing a fluorocarbon selected from the group consisting of $CF_4$ and $CHF_3$ gas at a flow rate of approximately 5–15 sccm, flowing a chlorine gas at a range of approximately 5–50 sccm, flowing an Argon gas at a range of approximately 0–50 sccm, flowing an oxygen gas at a rate of approximately 0–50 sccm, sustaining a process chamber pressure in a range of approximately 2–50 mTorr, sustaining a bias power in the range of approximately 100–500 Watts, sustaining a plasma generating source power in the range of approximately 200–3000 W and sustaining a process temperature in the range of approximately 200–600° C.

13. The method of claim 1 wherein the step (b) etch is conducted by introducing process gases in a ratio of approximately 0.4:1 to 40:1 carbon monoxide:chlorine.

14. The method of claim 1 wherein the step (c) deposition further comprises flowing a $CHF_3$ gas at a range of approximately 20–200 sccm, sustaining a process chamber temperature in a range of approximately 5–80° C., sustaining a process chamber pressure in a range of approximately 5–50 mTorr, sustaining a bias power in a range of approximately 0–50 Watts, and sustaining a plasma source generation power in a range of approximately 300–2000 W.

15. The method of claim 14 wherein the step (c) deposition further comprises flowing a $CHF_3$ gas of approximately 100 sccm, sustaining a process chamber temperature of approximately 40° C., sustaining a process chamber pressure of approximately 35 mTorr, sustaining a bias power of 0 Watts, and sustaining a plasma source generation power of approximately 500 W.

16. The method of claim 1, wherein step (d) etch is conducted by flowing a carbon monoxide gas at a range of approximately 20–200 sccm, flowing a fluorocarbon gas at a flow rate of approximately 5–15 sccm, flowing a chlorine gas at a range of approximately 5–50 sccm, flowing an Argon gas at a range of approximately 0–50 sccm, flowing an oxygen gas at a rate of approximately 0–50 sccm, sustaining a process chamber pressure in a range of approximately 2–50 MTorr, sustaining a bias power in the range of approximately 100–500 Watts, sustaining a plasma generating source power in the range of approximately 200–3000 W and sustaining a process temperature in the range of approximately 200–600° C.

17. The method of claim 16, wherein step (d) etch further comprises flowing a carbon monoxide gas at a rate of approximately 60 sccm, flowing a fluorocarbon gas selected from the group consisting of $CF_4$ and $CHF_3$ at a rate of approximately 12 sccm, flowing a chlorine gas at rate of approximately 15 sccm, flowing an Argon gas at a rate of approximately 15 sccm, flowing an oxygen gas at a rate of approximately 10 sccm, sustaining a chamber pressure of approximately 20 MTorr, maintaining a bias power of approximately 350 W, sustaining a plasma generating source power of approximately 1250 W and sustaining a chamber temperature of approximately 350° C.

18. The method of claim 16 wherein the step (d) etch further comprises a first mini-etch step and a second mini-etch step.

19. The method of claim 18 wherein the first mini-etch step is conducted by flowing a carbon monoxide gas at a range of approximately 20–200 sccm, flowing a fluorocarbon gas at a flow rate of approximately 5–15 sccm, flowing a chlorine gas at a range of approximately 5–50 sccm, flowing an Argon gas at a range of approximately 0–50 sccm, flowing an oxygen gas at a rate of approximately 0–50 sccm, sustaining a process chamber pressure in a range of approximately 2–50 mTorr, sustaining a bias power in the range of approximately 100–500 Watts, sustaining a plasma generating source power in the range of approximately 200–3000 W and sustaining a process temperature in the range of approximately 200–600° C.

20. The method of claim 19 further comprising transitioning the flow of fluorocarbon gas with a flow of nitrogen containing gas to initiate the second mini-etch step.

21. The method of claim 20 where the second mini-etch step is conducted by flowing a carbon monoxide gas at a range of approximately 20–200 sccm, flowing a nitrogen gas at a flow rate of approximately 0–15 sccm, flowing a chlorine gas at a range of approximately 5–50 sccm, flowing an Argon gas at a range of approximately 0–50 sccm, flowing an oxygen gas at a rate of approximately 0–50 sccm, sustaining a process chamber pressure in a range of approximately 2–50 mTorr, sustaining a bias power in the range of approximately 100–500 Watts, sustaining a plasma generating source power in the range of approximately 200–3000 W and sustaining a process temperature in the range of approximately 200–600° C.

22. The method of claim 1 wherein the step (d) etch is conducted by introducing process gases in a ratio of approximately 0.4:1 to 40:1 carbon monoxide:chlorine.

23. The method of claim 1 wherein the ferroelectric material is selected from the group consisting of lead zirconate titanate (PZT) and strontium barium titanate (SBT).

24. The method of claim 1 further comprising a substrate pre-heating step between steps (a) and (b).

25. The method of claim 24, wherein said pre-heating step comprises preheating said substrate in a temperature range of about 200° C. to 600° C.

26. The method of claim 24, wherein said pre-heating step comprises preheating said substrate to a temperature of about 350° C.

27. The method of claim 24 wherein said pre-heating step comprises:
supplying a process gas selected from the group consisting of nitrogen and argon; and
igniting said process gas to form a plasma.

28. The method of claim 27, wherein said supplying step comprises:
providing argon at a flow rate in a range of about 10–200 sccm;
setting a chamber pressure of about 5–50 milliTorr; and
providing plasma generating power in a range of about 500 W to 2000 W.

29. The method of claim 27, wherein said supplying step comprises:
providing argon at a flow rate of about 100 sccm;
providing a chamber pressure of about 30 milliTorr; and
providing plasma generating power of about 750 W.

30. The method of claim 1, wherein the ferroelectric layer is disposed between a first conductive layer and a second conductive layer.

31. The method of claim 30, wherein the first conductive layer is etched during step (b) and the second conductive layer is etched during step (d).

32. The method of claim 30 further comprising:
a hard mask disposed on the first conductive layer.

33. The method of claim 32, wherein the hard mask material is formed from at least one of titanium, titanium nitride, titanium aluminum nitride and titanium tungsten.

34. The method of claim 30 wherein the first and second conductive layers are formed from at least one of iridium, platinum, ruthenium, iridium oxide and ruthenium oxide.

35. A method of etching a ferroelectric layer, the method comprising:
(a) providing a substrate comprising a ferroelectric layer;
(b) partially etching said ferroelectric layer etch using a process gases in a ratio of approximately 0.4:1 to 40:1 carbon monoxide:chlorine;
(c) depositing a protective layer over portions of the partially etched ferroelectric layer; and
(d) substantially anisotropically etching the partially etched ferroelectric layer.

36. The method of claim 35 wherein the protective layer further comprises a dielectric material.

37. The method of claim 36, wherein the dielectric material is selected from the group consisting of polymer based materials, oxides, nitrides and alumina.

38. The method of claim 35, wherein that step (b) etch further comprises:
maintaining a plasma formed from a gas mixture containing at least carbon monoxide gas, a fluorocarbon gas a chlorine gas, Argon, and oxygen gas.

39. The method of claim 35 wherein the step (c) deposition further comprises:
maintaining a plasma formed from $CHF_3$.

40. The method of claim 35, wherein step (d) etch further comprises:
maintaining a plasma formed from a carbon monoxide gas, a fluorocarbon gas, a chlorine gas, Argon, and an oxygen gas.

41. The method of claim 35 wherein the step (d) etch is conducted by introducing process gases in a ratio of approximately 0.4:1 to 40:1 carbon monoxide:chlorine.

42. The method of claim 35 wherein the ferroelectric material is selected from the group consisting of lead zirconate titanate (PZT) and strontium barium titanate (SBT).

43. The method of claim 35 further comprising a substrate pre-heating step between steps (a) and (b).

44. The method of claim 43, wherein said pre-heating step comprises preheating said substrate in a temperature range of about 200° C. to 600° C.

45. The method of claim 43, wherein said pre-heating step comprises:
supplying a process gas selected from the group consisting of nitrogen and argon; and
igniting said process gas to form a plasma.

46. The method of claim 45, wherein said supplying step comprises:
providing argon at a flow rate in a range of about 10–200 sccm;
setting a chamber pressure of about 5–50 milliTorr; and
providing plasma generating power in a range of about 500 W to 2000W.

47. The method of claim 35, wherein the protective layer is selected from the group consisting of aluminum oxides or nitrides which are deposited ex-situ with respect to a location in which the step (b) etch is performed.

48. A method of etching a ferroelectric layer, the method comprising:
(a) providing a substrate comprising a ferroelectric layer;
(b) partially etching said ferroeletric layer;
(c) depositing a protective layer over portions of the partially etched ferroelectric layer; and
(d) substantially anisotropically etching the partially etched ferroelectric layer, wherein the etching step (d) is conducted by introducing process gases in a ratio of approximately 0.4:1 to 40:1 carbon monoxide:chlorine.

49. The method of claim 48, wherein the protective layer further comprises a dielectric material.

50. The method of claim 49, wherein the dielectric material is selected from the group consisting of polymer based materials, oxides, nitrides and alumina.

51. The method of claim 48, wherein the protective layer is selected from the group consisting of aluminum oxides or nitrides which are deposited ex-situ with respect to a location in which the step (b) etch is performed.

52. The method of claim 48, wherein the step (b) etch further comprises:
maintaining a plasma formed from a gas mixture containing at least carbon monoxide gas, a fluorocarbon gas a chlorine gas, Argon, and oxygen gas.

53. The method of claim 48 wherein the step (c) deposition further comprises:
maintaining a plasma formed from $CHF_3$.

54. The method of claim 48, wherein step (d) etch further comprises:
maintaining a plasma formed from a carbon monoxide gas, a fluorocarbon gas, a chlorine gas, Argon, and an oxygen gas.

55. The method of claim 48, wherein the ferroelectric material is selected from the group consisting of lead zircona titanate (PZT) and strontium barium titanate (SBT).

56. The method of claim 48, further comprising a substrate pre-heating step between steps (a) and (b).

57. The method of claim 56, wherein said pre-heating step comprises preheating said substrate in a temperature range of about 200° C. to 600° C.

58. The method of claim 56, wherein said pre-heating step comprises:
supplying a process gas selected from the group consisting of nitrogen and argon; and
igniting said process gas to form a plasma.

59. The method of claim 58, wherein said supplying step comprises:
providing argon at a flow rate in a range of about 10–200 sccm;
setting a chamber pressure of about 5–50 milliTorr; and 60. A method of etching a ferroelectric layer, the method comprising:
(a) heating a substrate comprising a ferroelectric layer;
(b) partially etching said heated ferroelectric layer;
(c) depositing a protective layer over portions of the partially etched ferroelectric layer; and
(d) substantially anisotropically etching the partially etched ferroelectric layer.

61. The method of claim 60, wherein the protective layer further comprises a dielectric material.

62. The method of claim 61, wherein the dielectric material is selected from the group consisting of polymer based materials oxides, nitrides and alumina.

63. The method of claim 60, wherein said heating step comprises:

supplying a process gas selected from the group consisting of nitrogen and argon; and igniting said process gas to form a plasma.

64. The method of claim 63, wherein said supplying step comprises:

providing argon at a flow rate in a range of about 10–200 sccm;

setting a chamber pressure of about 5–50 milliTorr; and providing plasma generating power in a range of about 500 W to 2000 W.

65. The method of claim 60, wherein the protective layer is selected from the group consisting of aluminum oxides or nitrides which are deposited ex-situ with respect to a location in which the step (b) etch is performed.

66. The method of claim 60, wherein the step (b) etch further comprises:

maintaining a plasma formed from a gas mixture containing at least carbon monoxide gas, a fluorocarbon gas a chlorine gas, Argon, and oxygen gas.

67. The method of claim 60, wherein the step (c) deposition further comprises:

maintaining a plasma formed from $CHF_3$.

68. The method of claim 60, wherein step (d) etch further comprises:

maintaining a plasma formed from a carbon monoxide gas, a fluorocarbon gas, a chlorine gas, Argon, and an oxygen gas.

69. The method of claim 60, wherein the ferroelectric material is selected from the group consisting of lead zirconate titanate (PZT) and strontium barium titanate (SBT).

70. The method of claim 60, wherein said heating step comprises preheating said substrate in a temperature range of about 200° C. to 600° C.

71. A method of etching a ferroelectric layer, the method comprising:

(a) providing a substrate comprising a ferroelectric layer;

(b) partially etching said ferroelectric layer;

(c) depositing a protective layer over portions of the partially etched ferroelectric layer, wherein the protective layer is selected from the group consisting of aluminum oxides or nitrides which are deposited ex-situ with respect to a location in which the etch step (b) is performed; and (d) substantially anisotropically etching the partially etched ferroelectric layer.

72. The method of claim 71, wherein the protective layer further comprises a dielectric material.

73. The method of claim 71, wherein the step (b) etch further comprises:

maintaining a plasma formed from a gas mixture containing at least carbon monoxide gas, a fluorocarbon gas a chlorine gas, Argon, and oxygen gas.

74. The method of claim 71, wherein step (d) etch further comprises:

maintaining a plasma formed from a carbon monoxide gas, a fluorocarbon gas, a chlorine gas, Argon, and an oxygen gas.

75. The method of claim 71, wherein the ferroelectric material is selected from the group consisting of lead zirconate titanate (PZT) and strontium barium titanate (SBT).

76. The method of claim 71, further comprising a substrate pre-heating step between steps (a) and (b), wherein said pre-heating step comprises:

preheating said substrate in a temperature range of about 200° C. to 600° C.

77. The method of claim 76, wherein said pre-heating step comprises:

supplying a process gas selected from the group consisting of nitrogen and argon; and igniting said process gas to form a plasma.

78. The method of claim 77, wherein said supplying step comprises:

providing argon at a flow rate in a range of about 10–200 sccm;

setting a chamber pressure of about 15–50 milliTorr; and providing plasma generating power in a range of about 500 W to 2000 W.

* * * * *

UNITED STATES PATENT AND TRADEMARK OFFICE
CERTIFICATE OF CORRECTION

PATENT NO. : 6,943,039 B2
DATED : September 13, 2005
INVENTOR(S) : Ying et al.

It is certified that error appears in the above-identified patent and that said Letters Patent is hereby corrected as shown below:

Column 3,
Line 4, delete "ferroelectiic" and insert -- ferroelectric --, therefor.
Line 16, insert -- a -- before "layer".
Line 16, delete "TIN" and insert -- TiN --, therefor.
Line 17, delete "TIAIN" and insert -- TiAlN --, therefor.

Column 11,
Line 15, after "gas" insert -- at --.
Line 16, after "sccm" insert -- , --.
Line 54, after "MTorr" and insert -- mTorr --, therefor.
Line 67, delete "MTorr" and insert -- mTorr --, therefor.

Column 12,
Line 22, delete "where" and insert -- wherein --, therefor.

Column 14,
Line 8, delete "ferroeletric" and insert -- ferroelectric --, therefor.
Line 40, delete "zircona" and insert -- zirconate --, therefor.

Column 15,
Line 3, after "materials" insert -- , --.

Column 16,
Line 41, delete "15-50" and insert -- 5-50 --, therefor.

Signed and Sealed this

Twenty-ninth Day of November, 2005

JON W. DUDAS
*Director of the United States Patent and Trademark Office*